(12) United States Patent
Kakkad et al.

(10) Patent No.: US 7,696,030 B2
(45) Date of Patent: *Apr. 13, 2010

(54) METHOD OF FABRICATING SEMICONDUCTOR DEVICE AND SEMICONDUCTOR FABRICATED BY THE SAME METHOD

(75) Inventors: Ramesh Kakkad, Suwon-si (KR); Yong-Seog Kim, Suwon-si (KR)

(73) Assignee: Samsung Mobile Display Co., Ltd., Yongin (KR)

(*) Notice: Subject to any disclaimer, the term of this patent is extended or adjusted under 35 U.S.C. 154(b) by 0 days.

This patent is subject to a terminal disclaimer.

(21) Appl. No.: 11/082,982

(22) Filed: Mar. 18, 2005

(65) Prior Publication Data

US 2006/0003501 A1 Jan. 5, 2006

(30) Foreign Application Priority Data

Jun. 30, 2004 (KR) .................. 10-2004-0050863

(51) Int. Cl.
*H01L 21/20* (2006.01)
(52) U.S. Cl. .................................. 438/166
(58) Field of Classification Search .......... 438/96, 438/97, 479, 486, 141, 151, 166, 482, 488; 439/795–799
See application file for complete search history.

(56) References Cited

U.S. PATENT DOCUMENTS

| | | | | |
|---|---|---|---|---|
| 5,466,641 A * | 11/1995 | Shimizu et al. | ............. | 438/166 |
| 5,529,951 A * | 6/1996 | Noguchi et al. | ............. | 438/487 |
| 6,146,905 A * | 11/2000 | Chivukula et al. | ............. | 438/3 |
| 6,239,451 B1 * | 5/2001 | Fonash et al. | ............. | 257/53 |
| 6,881,618 B2 * | 4/2005 | Yamamoto | ............. | 438/199 |
| 2002/0072157 A1 * | 6/2002 | Jinno et al. | ............. | 438/158 |
| 2002/0102820 A1 * | 8/2002 | Hamada et al. | ............. | 438/486 |
| 2004/0232495 A1 * | 11/2004 | Saito et al. | ............. | 257/382 |
| 2005/0186720 A1 * | 8/2005 | Kakkad | ............. | 438/166 |

FOREIGN PATENT DOCUMENTS

CN 1108004 9/1995

(Continued)

OTHER PUBLICATIONS

<Watakabe et al, "Polycrystalline Silicon Thin-film Transistors Fabricated by defect reduction Mehtods", IEEE Transaction on Electronic devcies, vol. 49, No. 12, Dec. 2002, pp. 2217-2221).*

*Primary Examiner*—Savitri Mulpuri
(74) *Attorney, Agent, or Firm*—H.C. Park & Associates, PLC (57) ABSTRACT

A method of fabricating a semiconductor device and a semiconductor device fabricated by the same method are disclosed. The method includes: depositing a silicon layer containing amorphous silicon on a substrate using any one of a plasma enhanced chemical vapor deposition (PECVD) method and a low pressure chemical vapor deposition (LPCVD) method; annealing the silicon layer in an $H_2O$ atmosphere at a certain temperature to form a polycrystalline silicon layer; forming a gate insulating layer on the polycrystalline silicon layer; forming impurity regions in the polycrystalline silicon layer to define source and drain regions; and activating the impurity regions. Thus, it is possible to provide a semiconductor device, in which the substrate is prevented from being bent and polycrystalline silicon constituting a semiconductor layer is excellent.

16 Claims, 9 Drawing Sheets

FOREIGN PATENT DOCUMENTS

| | | |
|---|---|---|
| JP | 63-304670 | 12/1988 |
| JP | 05-021463 | 1/1993 |
| JP | 05-182919 | 7/1993 |
| JP | 08-051212 | 2/1996 |
| JP | 08-330598 | 12/1996 |
| JP | 10-189449 | 7/1998 |
| JP | 11-261078 | 9/1999 |
| JP | 2000-315794 | 11/2000 |
| JP | 2003-168803 | 6/2003 |
| KR | 10-0233803 | 12/1999 |
| KR | 10-0299292 | 12/2001 |

\* cited by examiner

METHOD OF FABRICATING SEMICONDUCTOR DEVICE AND SEMICONDUCTOR FABRICATED BY THE SAME METHOD

This application claims priority to and the benefit of Korean Patent Application No. 2004-50863, filed Jun. 30, 2004, the contents of which are hereby incorporated herein by reference in their entirety.

BACKGROUND OF THE INVENTION

1. Field of the Invention

The present invention relates to a method of fabricating a semiconductor device and, more particularly, to a method of fabricating a semiconductor device by which a substrate may be prevented from being bent, and a semiconductor device fabricated by the same method.

2. Description of Related Art

Polycrystalline silicon is used in an active device for an organic light emitting display device, normally, thin film transistors (TFTs), which is used to supply current to pixel regions and peripheral driving regions.

In general, the polycrystalline silicon is formed by crystallization of amorphous silicon.

Normally, methods for the crystallization may be largely classified into a low-temperature crystallization method and a high-temperature crystallization method depending on a crystallization temperature, for example, with reference to about 500° C.

An excimer laser annealing (ELA) method using an excimer laser is mainly used as the low-temperature crystallization method. The eximer laser annealing method may use a glass substrate since it is carried out at a crystallization temperature of about 450° C. However, manufacturing cost is high and the substrate is constrained in an optimal size, thereby increasing total cost to fabricate a display device.

The high-temperature crystallization method includes a solid phase crystallization method, a rapid thermal annealing method, and the like. A low-cost annealing method is widely used as the high-temperature crystallization method.

However, since the solid phase crystallization method requires heating at a temperature of more than 600° C. for 20 or more hours for crystallization, many crystal defects are included in the crystallized polycrystalline silicon. Accordingly, sufficient electric field mobility cannot be obtained, the substrate is prone to deform during an annealing process, i.e., a heat treatment process, and lowered crystallization temperature degrades productivity. Because the solid phase crystallization method is also performed at high crystallization temperature, a glass substrate may be used.

Meanwhile, although the rapid thermal annealing (RTA) method may be accomplished in relatively short time, the substrate is prone to deform due to severe thermal shock and the crystallized polycrystalline silicon has poor electrical characteristics.

Consequently, a low-cost high-temperature annealing method may be required to be used upon the crystallization in order to reduce cost to fabricate the active device. Moreover, there is a need for a high-temperature annealing method using an inexpensive glass substrate, by which the glass substrate is not bent and crystallinity is excellent.

SUMMARY OF THE INVENTION

The present invention, therefore, solves aforementioned problems associated with conventional devices by providing a method of fabricating a semiconductor device which is capable of crystallizing polycrystalline silicon with excellent crystallinity and preventing a substrate from being bent due to a high crystallization temperature upon crystallization, and a semiconductor device fabricated by the same method.

In an exemplary embodiment of the present invention, a method of fabricating a semiconductor device includes: depositing a silicon layer containing amorphous silicon on a substrate using a plasma enhanced chemical vapor deposition (PECVD) method or a low pressure chemical vapor deposition (LPCVD) method; annealing the silicon layer in an $H_2O$ atmosphere at a predetermined temperature to form a polycrystalline silicon layer; forming a gate insulating layer on the polycrystalline silicon layer; forming impurity regions in the polycrystalline silicon layer; and activating the impurity regions.

In another exemplary embodiment of the present invention, a method of fabricating a semiconductor device includes: depositing a silicon layer containing amorphous silicon on a substrate using a plasma enhanced chemical vapor deposition (PECVD) method or a low pressure chemical vapor deposition (LPCVD) method; doping the silicon layer with impurity ions to define source and drain regions; patterning the amorphous silicon to form a semiconductor layer; forming a gate insulating layer on the semiconductor layer over the substrate; forming a gate electrode on the gate insulating layer, the gate electrode corresponding to a channel region of the semiconductor layer; and annealing the amorphous silicon in an $H_2O$ atmosphere at predetermined temperature to crystallize the amorphous silicon and activate the impurity ions.

In yet another exemplary embodiment of the present invention, a method of fabricating a semiconductor device includes: forming a gate electrode on a substrate; forming a gate insulating layer on the gate electrode over the substrate; depositing a silicon layer containing amorphous silicon on the gate insulating layer using a plasma enhanced chemical vapor deposition (PECVD) method or a low pressure chemical vapor deposition (LPCVD) method; doping impurity ions into the silicon layer using photoresist to define source and drain regions; and removing the photoresist and then annealing the amorphous silicon in an $H_2O$ atmosphere at a certain temperature to crystallize the amorphous silicon and to activate the impurity ions.

In still another exemplary embodiment of the present invention, a semiconductor device fabricated by the method, wherein the semiconductor device is a thin film transistor.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

The present invention will now be described more fully hereinafter with reference to the accompanying drawings, in which embodiments of the invention are shown. In the drawings, the thickness of the layers and regions are exaggerated for clarity.

FIGS. 1A to 1E sequentially illustrate a method of fabricating a semiconductor device according to a first embodiment of the present invention.

Figure 1A:
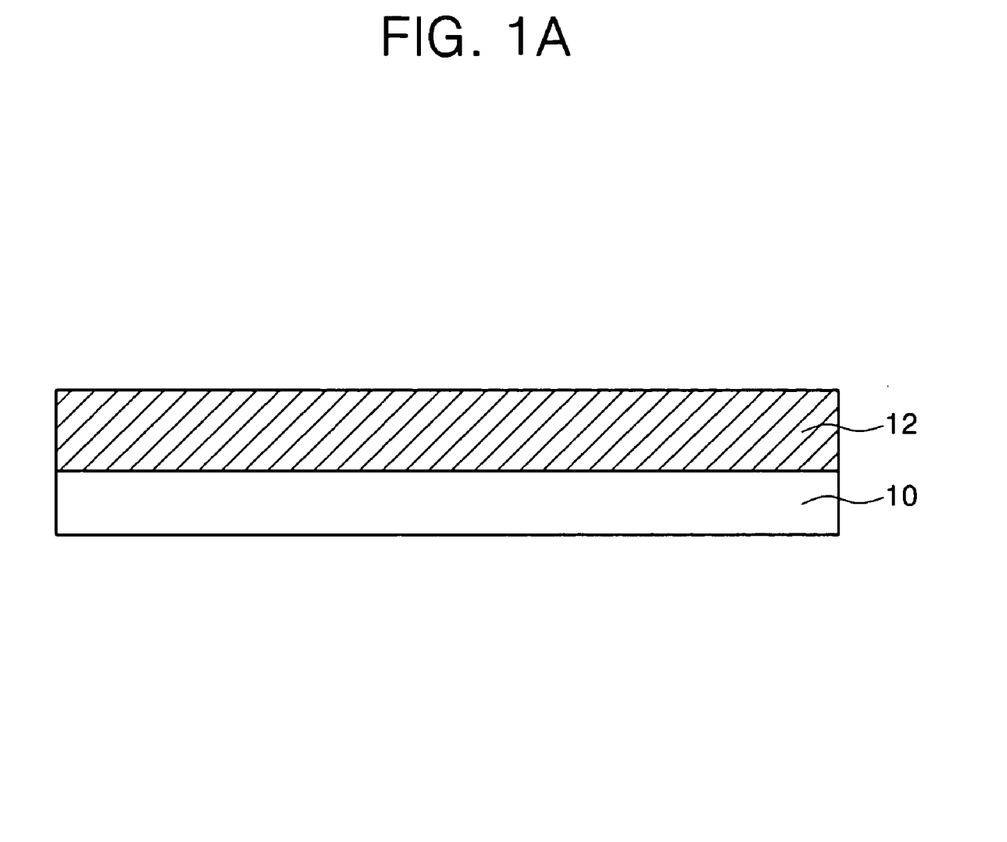
FIGS. 1A to 1E sequentially illustrate a method of fabricating a semiconductor device according to a first embodiment of the present invention.

Referring to FIG. 1A, amorphous silicon, or a silicon layer 12 containing a great quantity of amorphous silicon is deposited on a substrate 10. At this time, a normally used insulating and transparent glass substrate is used as the substrate 10.

A typical deposition method, such as a plasma enhanced chemical vapor deposition (PECVD) method or a low-pressure chemical vapor deposition (LPCVD) method, is used to deposit the silicon layer 12. The PECVD method is performed using $SiH_4+Ar$ and/or $H_2$ under a pressure of 1 to 1.5 Torr at a temperature of about 330 to about 430° C. Further, the LPCVD is performed using $Si_2H_6+Ar$ under a pressure of 0.2 to 0.4 Torr at a temperature of about 400 to about 500° C.

Further, a buffer layer such as a silicon nitride (SiNx) layer or a silicon oxide ($SiO_2$) layer may be further formed on the substrate prior to depositing the amorphous silicon layer, in order to prevent contaminants or the like created in the substrate from diffusing into the silicon layer or enhance interface characteristics between the silicon layer and the substrate.

Figure 1B:
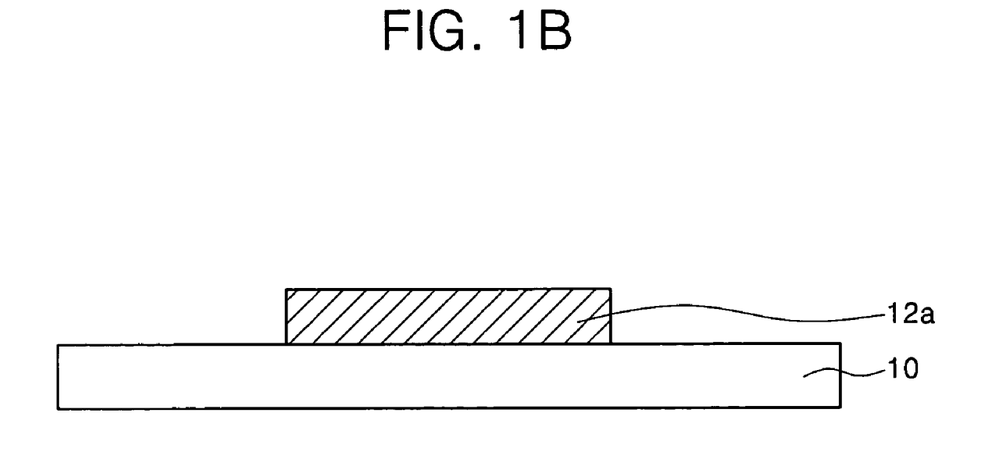

The amorphous silicon, or the silicon layer 12 that contains a great quantity of amorphous silicon is then annealed, as shown in FIG. 1B. At this time, when the silicon layer is heated, the amorphous silicon is not melt because at the same time, the amorphous silicon is cooled and crystallized into the polycrystalline silicon using the solid phase crystallization method. The polycrystalline silicon is then patterned to form a semiconductor layer 12a.

In the present invention, a rapid thermal annealing (RTA) process or a typical high-temperature annealing process in a furnace is used as the annealing process. Conventional annealing is carried out in an inert $N_2$ or $O_2$ atmosphere while the annealing in the present invention is carried out in an $H_2O$ atmosphere.

The annealing in the $H_2O$ atmosphere shortens annealing time under a condition of the same temperature and reduces annealing temperature under a condition of the same time, compared to the annealing in the $N_2$ or $O_2$ atmosphere.

In particular, a conventional glass substrate that is a transparent insulating substrate is bent due to a high temperature while the substrate in the present invention is not bent because the annealing temperature may be lowered.

In the present invention, the annealing temperature is preferably in the range of 550 to 750° C. More preferably, the annealing temperature is in the range of 600 to 710° C. because excellent polycrystalline silicon may be achieved with a proper annealing time. Crystallization may not be achieved when the annealing temperature is less than 550° C., and the substrate may be bent when it is more than 750° C.

Further, it is preferable that the pressure of $H_2O$ is in the range of 10,000 Pa to 2 MPa. A crystallization rate is proportional to the pressure and thus when the pressure is too low, the crystallization rate becomes low and the annealing time becomes longer, affecting the substrate. On the other hand, too high of a pressure may cause an explosion. For these reasons, the pressure of 10,000 Pa to 2 MPa is desirable for annealing.

Meanwhile, it is preferable to deposit the silicon layer to a thickness of less than 2,000 Å. Small thickness facilitates crystallization. However, too small thickness may affect the device characteristics when the polycrystalline silicon is used to form a thin film transistor. Accordingly, it is more preferable to deposit the silicon layer to a thickness of 300 to 1,000 Å.

Figure 1C:
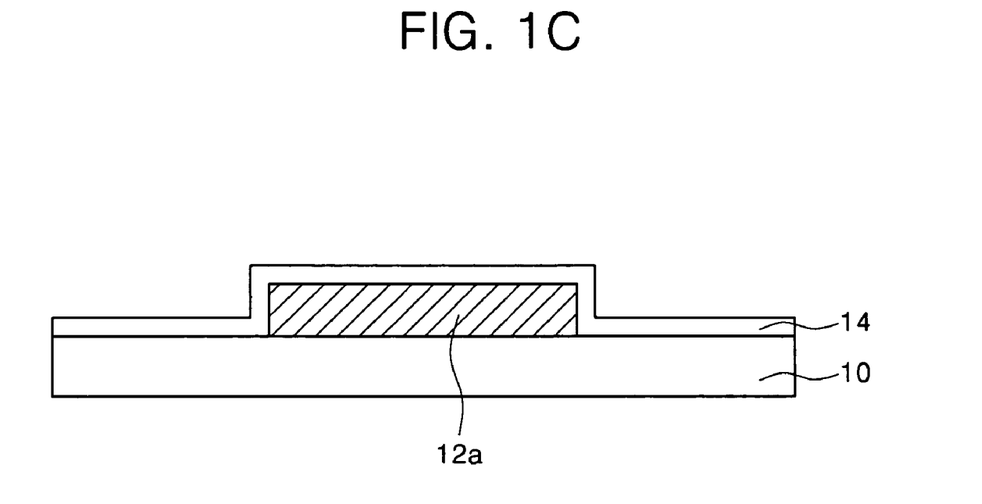
Figure 1D:
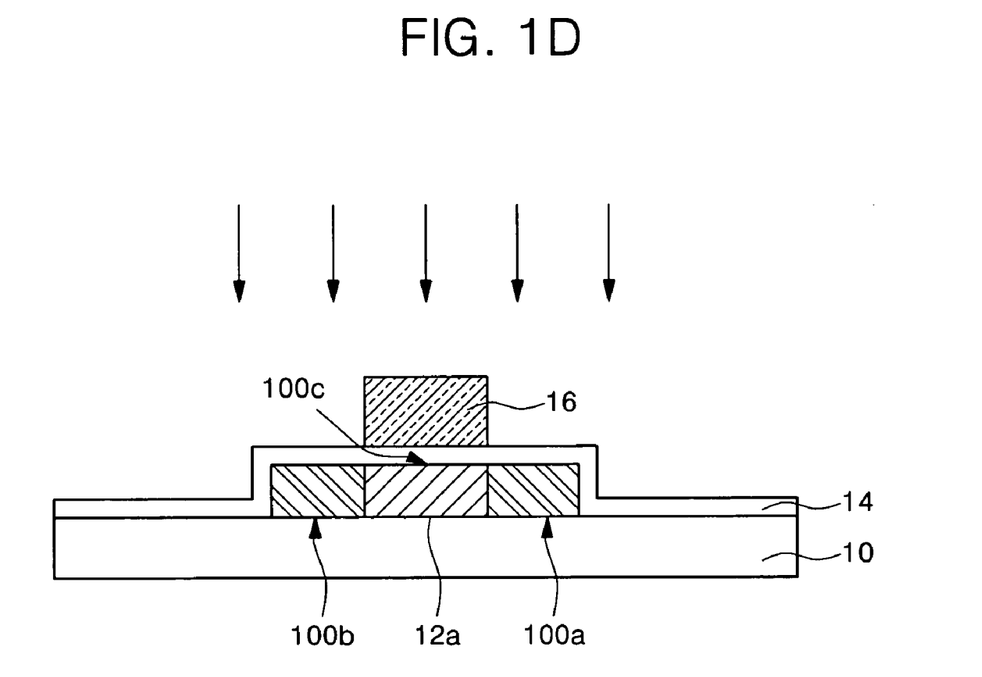

As shown in FIG. 1C, a gate insulating layer 14 is formed of $SiO_2$ or SiNx on the semiconductor layer 12a. A gate electrode 16 is formed corresponding to an active channel region 100c of the semiconductor layer 12a, as shown in FIG. 1D.

Figure 1E:
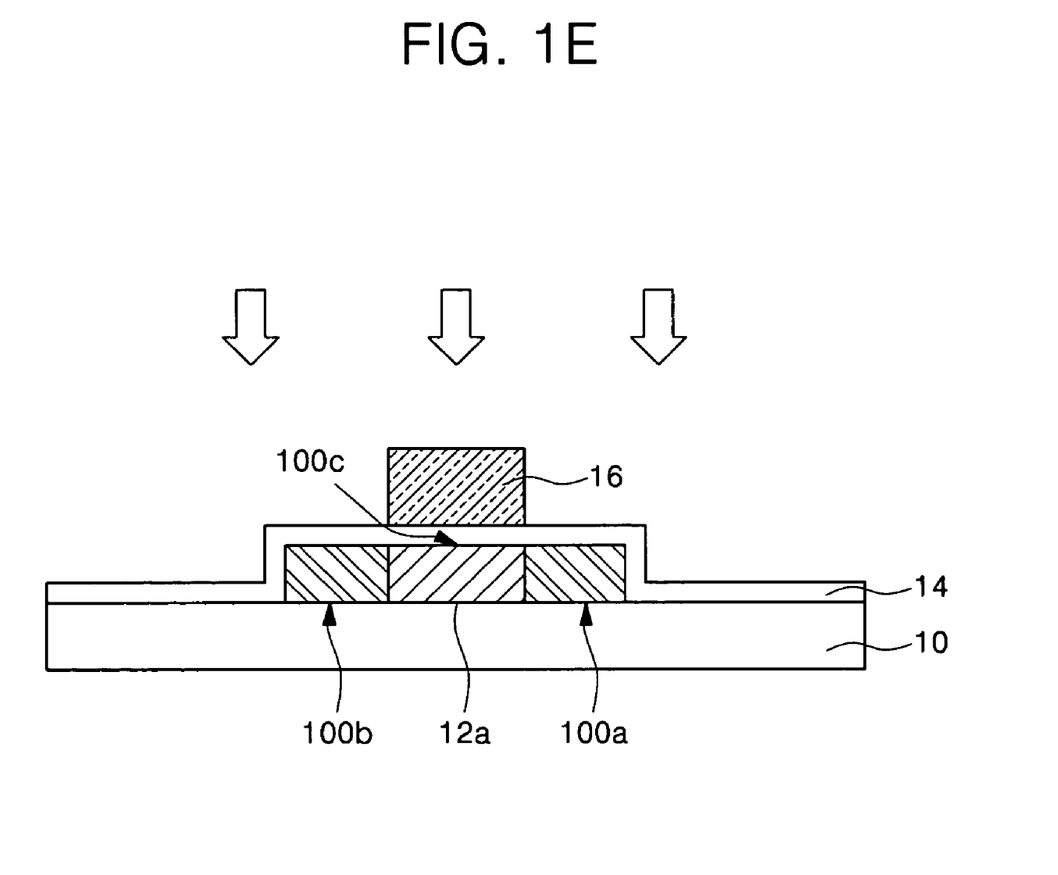

Ions are doped into the semiconductor layer 12a using the gate electrode 16 as a mask to form source and drain regions 100a and 100b. The semiconductor layer 12a, doped with the ions, is activated by an excimer laser annealing (ELA) process, an RTA process or an annealing process in a furnace, preferably the RTA or annealing process in the furnace, as shown in FIG. 1E.

Subsequently, an interlayer insulating layer, such as $SiO_2$ or SiNx, is formed on the gate electrode 16 over the entire surface of the substrate. The interlayer insulating layer is then patterned to expose the source and drain regions 100a and 100b and source and drain electrodes are formed, thus completing a semiconductor device.

FIGS. 2A to 2E sequentially illustrate a method of fabricating a semiconductor device according to a second embodiment of the present invention. The second embodiment of the present invention will be described with reference to FIGS. 2A to 2E.

Figure 2A:
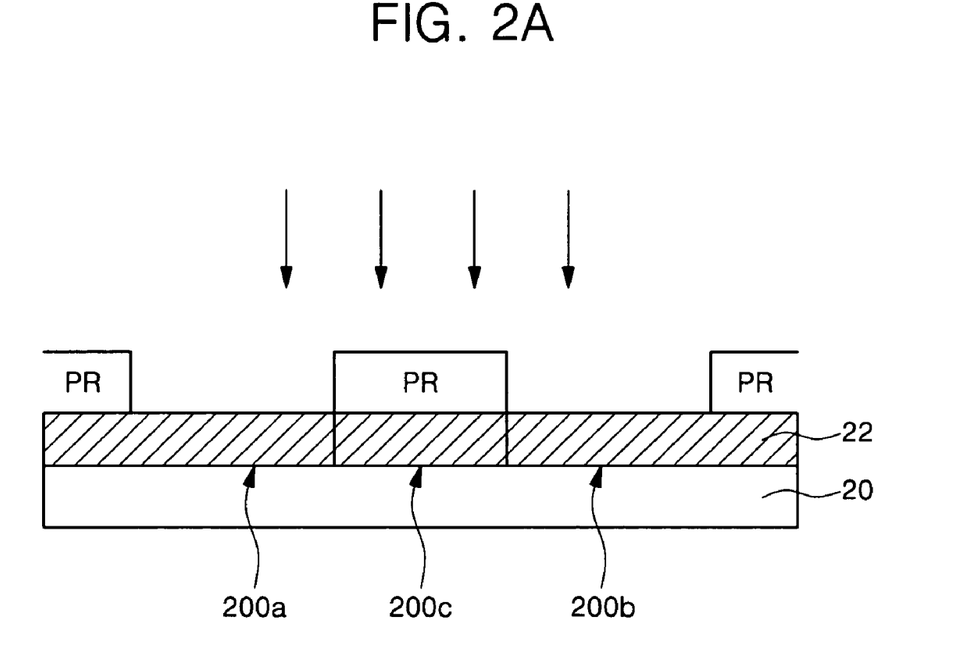
FIGS. 2A to 2E sequentially illustrate a method of fabricating a semiconductor device according to a second embodiment of the present invention.

Referring to FIG. 2A, amorphous silicon, or a silicon layer 22 containing a great quantity of amorphous silicon is deposited on a substrate 20. At this time, a normally used insulating and transparent glass substrate is used as the substrate 20.

A typical deposition method, such as a plasma enhanced chemical vapor deposition (PECVD) method or a low-pressure chemical vapor deposition (LPCVD) method, is used to deposit the silicon layer. The PECVD method is performed using $SiH_4+Ar$ and/or $H_2$ under a pressure of 1 to 1.5 Torr at a temperature of 330 to 430° C. Further, the LPCVD method is performed using $Si_2H_6+Ar$ under a pressure of 0.2 to 0.4 Torr at a temperature of about 400 to 500° C.

Further, a buffer layer such as SiNx or $SiO_2$ may be further formed on the substrate prior to depositing the amorphous silicon layer, in order to prevent contaminants or the like created in the substrate from diffusing into the silicon layer or enhance interface characteristics between the silicon layer and the substrate.

Photoresist is then coated on a channel region 200c in the silicon layer 22, not regions that will correspond to source and drain regions 200a and 200b later, and impurity ions are implanted into the silicon layer 22.

Figure 2B:
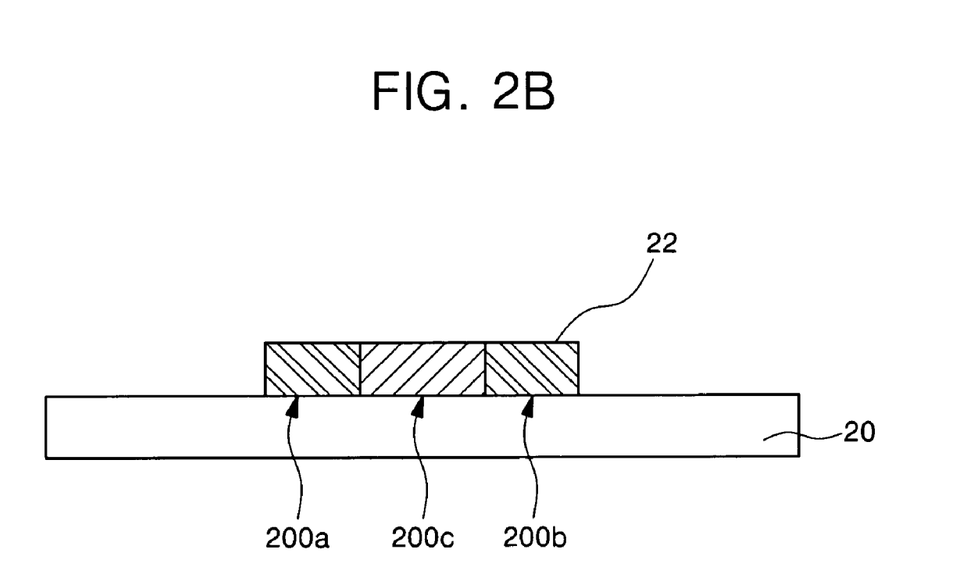

The photoresist is removed by, for example, photolithography and etching processes and then the silicon layer 22 doped with the impurity is patterned, as shown in FIG. 2B.

Figure 2C:
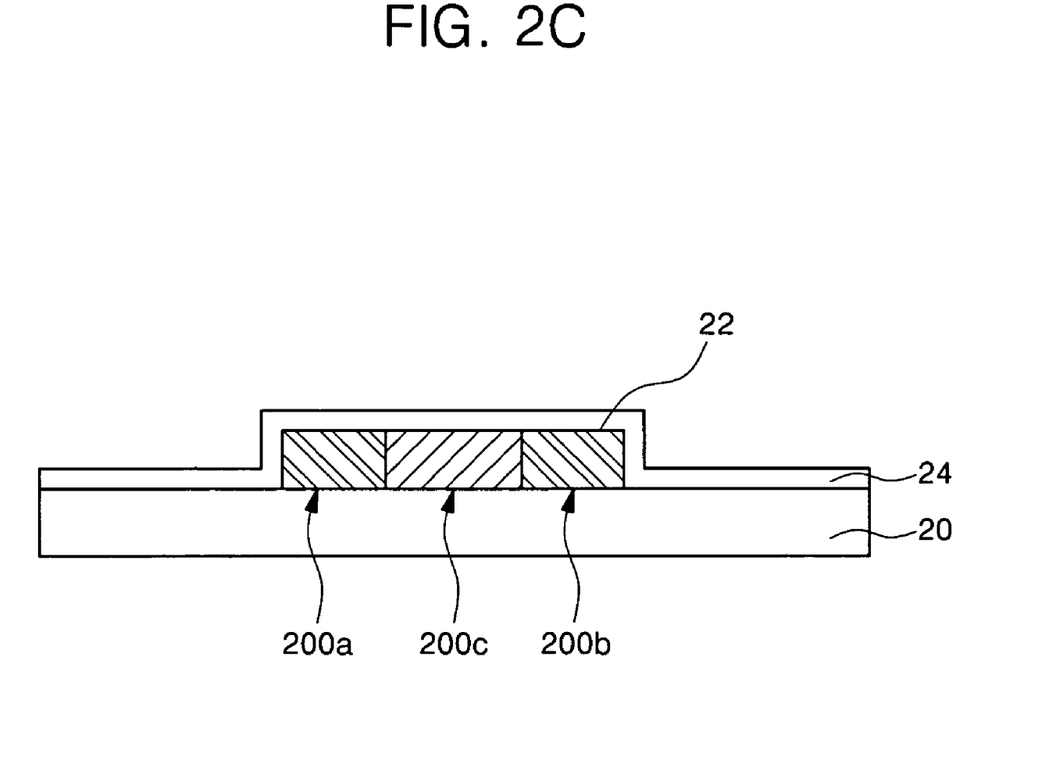

A gate insulating layer 24 is then formed of an inorganic insulating layer such as $SiO_2$ or SiNx on the patterned silicon layer 22, as shown in FIG. 2C.

Figure 2D:
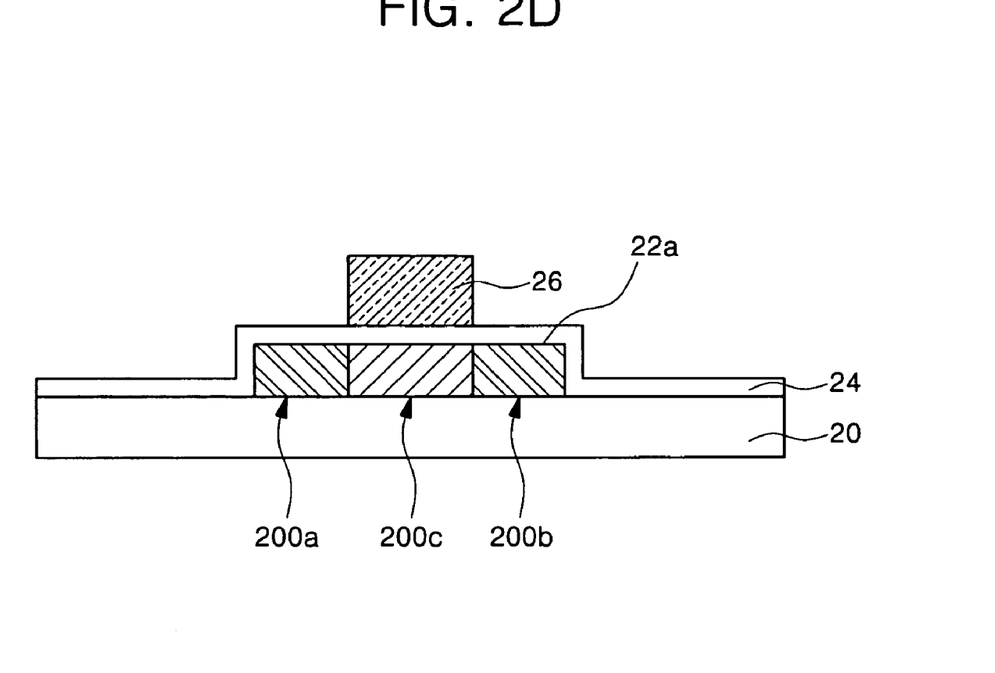

Subsequently, as shown in FIG. 2D, a gate 26 is formed in a region corresponding to the channel region 200c and annealing is carried out.

During the annealing process, the impurity ions doped into the source and drain regions 200a and 200b are activated and concurrently the silicon layer 22 containing the amorphous silicon is crystallized into the polycrystalline silicon layer 22a.

In the present invention, a typical high-temperature annealing process such as a rapid thermal annealing (RTA) process is used as the annealing process. Conventional annealing is carried out under an inert $N_2$ or $O_2$ atmosphere while the annealing in the present invention is carried out in an $H_2O$ atmosphere.

The annealing in the $H_2O$ atmosphere shortens annealing time under a condition of the same temperature and reduces annealing temperature under a condition of the same time, compared to the annealing in the $N_2$ or $O_2$ atmosphere.

In particular, a conventional glass substrate that is a transparent insulating substrate is bent due to a high temperature while the substrate in the present invention is not bent because the annealing temperature may be lowered.

In the present invention, the annealing temperature is preferably in the range of 550 to 750° C. More preferably, the annealing temperature is in the range of 600 to 710° C. because excellent polycrystalline silicon may be achieved with a proper annealing time. Crystallization may not be achieved when the annealing temperature is less than 550° C., and the substrate may be bent when it is more than 750° C.

Further, it is preferable that the pressure of $H_2O$ is in the range of 10,000 Pa to 2 MPa. A crystallization rate is proportional to the pressure and thus when the pressure is too low, the crystallization rate becomes low and the annealing time becomes longer, affecting the substrate. On the other hand, too high of a pressure may cause an explosion. For these reasons, the pressure of 10,000 Pa to 2 MPa is desirable for annealing.

Meanwhile, it is preferable to deposit the silicon layer to a thickness of less than 2,000 Å. Small thickness facilitates crystalli device characteristics when the polycrystalline silicon is used to form a thin film transistor. Accordingly, it is more preferable to deposit the silicon layer to a thickness of 300 to 1,000 Å.

Although the above-described processes suffice to obtain the polycrystalline silicon, the present invention may further include an annealing process to reduce defects in the formed polycrystalline silicon.

The further annealing process may be performed by an excimer laser annealing process or heating in a furnace.

Figure 2E:
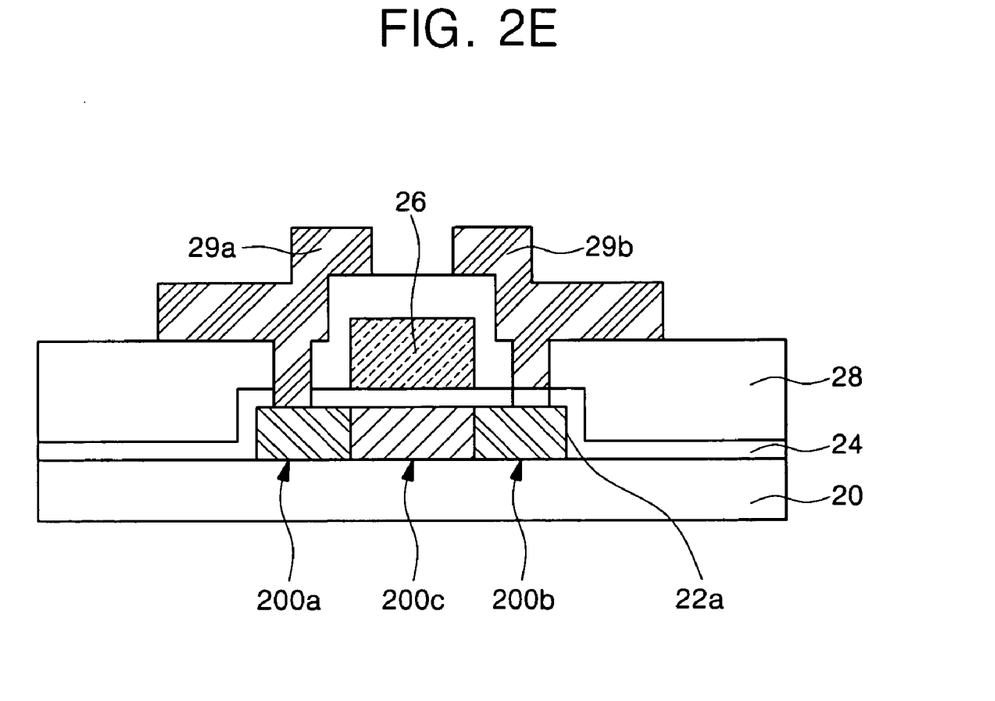

Subsequently, as shown in FIG. 2E, an interlayer insulating layer 28 is formed on the gate electrode 26 over the entire surface of the substrate, and both the interlayer insulating layer 28 and the gate insulating layer 24 are etched to form contact holes so that the source and drain regions 200a and 200b are open. Metal is filled into the contact holes to form source and drain electrodes 29a and 29b, thus completing the thin film transistor.

FIGS. 3A to 3D sequentially illustrate a method of fabricating a semiconductor device according to a third embodiment of the present invention. The method of fabricating the semiconductor device according to the third embodiment of the present invention will be described with reference to FIGS. 3A to 3D.

Figure 3A:
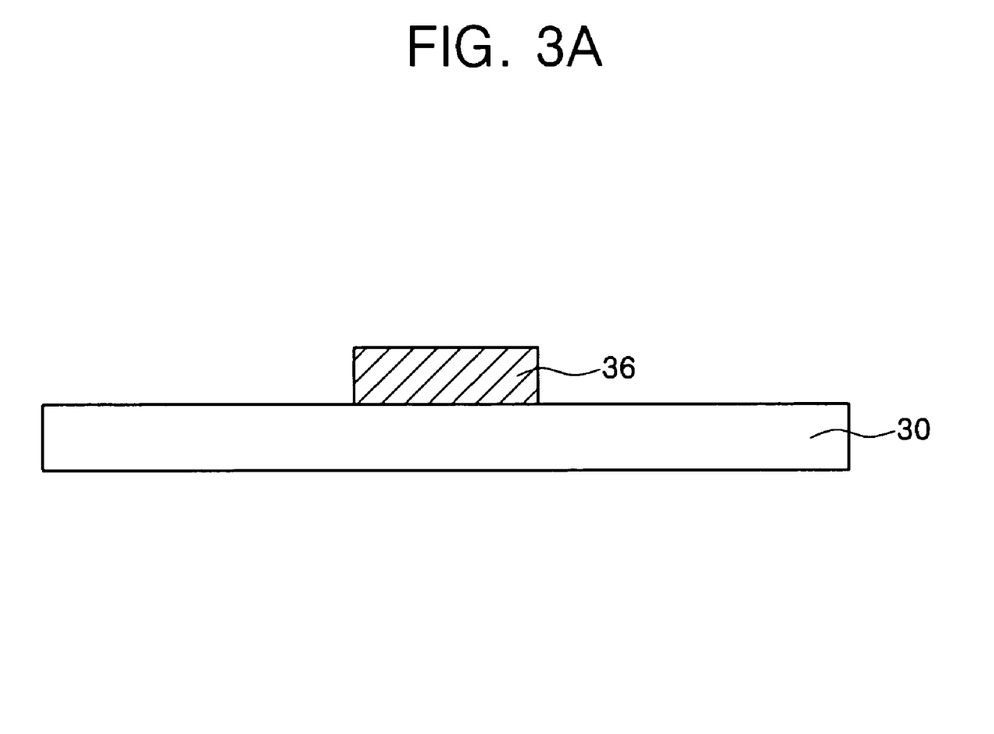
FIGS. 3A to 3D sequentially illustrate a method of fabricating a semiconductor device according to a third embodiment of the present invention.

Referring to FIG. 3A, patterning is carried out to form a gate electrode 36 on a substrate 30. At this time, a normally used insulating and transparent glass substrate is used as the substrate 30.

Further, a buffer layer such as SiNx or $SiO_2$ may be formed on the substrate 30 in order to prevent contaminants or the like created in the substrate from diffusing into the electrode or enhance interface characteristics between the substrate and the electrode.

A gate insulating layer 34 is then formed of an inorganic insulating layer such as $SiO_2$ or SiNx on the gate electrode 36 over the entire surface of the substrate 30.

Figure 3B:
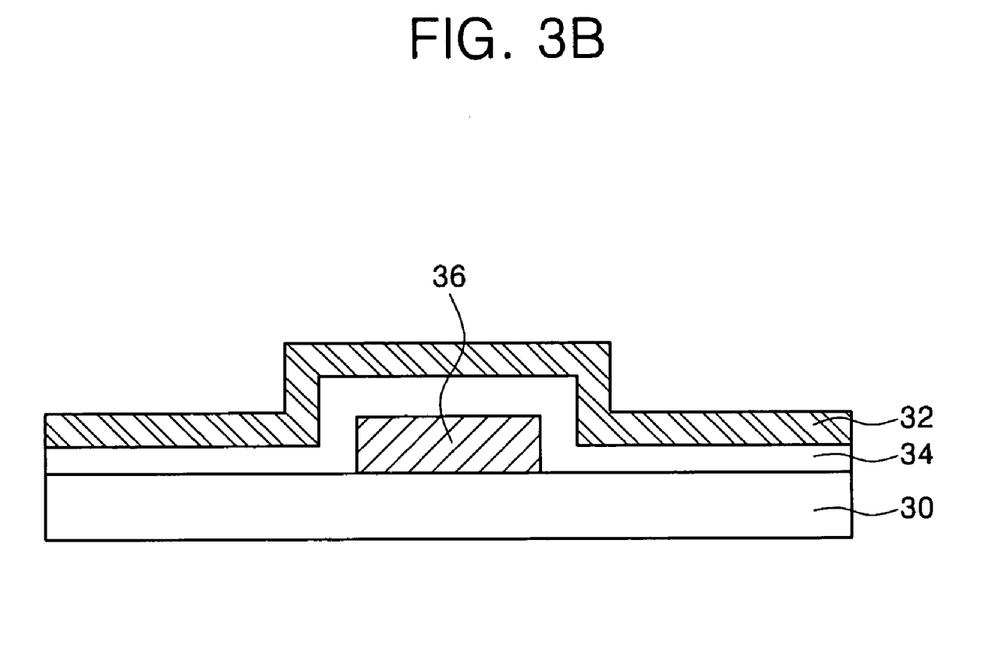

Subsequently, amorphous silicon, or a silicon layer 32 containing a great quantity of amorphous silicon is deposited on the gate insulating layer 34, as shown in FIG. 3B.

A typical deposition method, such as a plasma enhanced chemical vapor deposition (PECVD) method or a low-pressure chemical vapor deposition (LPCVD) method, is used to deposit the silicon layer 32. The PECVD method is performed using $SiH_4$+Ar and/or $H_2$ under a pressure of 1 to 1.5 Torr at a temperature of 330 to 430° C. Further, the LPCVD method is performed using $Si_2H_6$+Ar under a pressure of 0.2 to 0.4 Torr at a temperature of about 400 to 500° C.

Figure 3C:
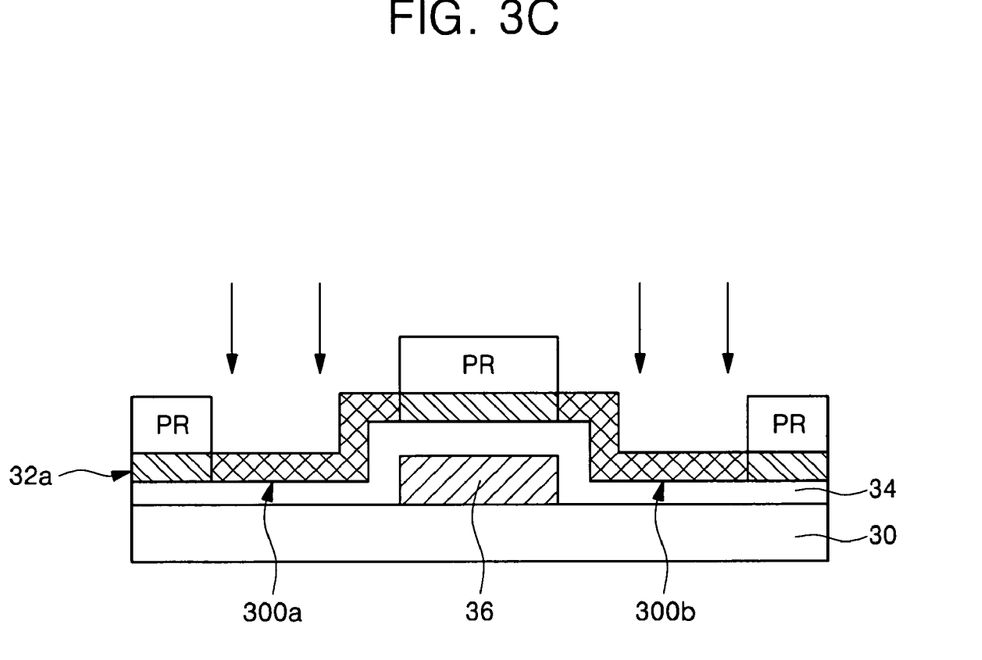

Photoresist is then coated on a channel region 300c in the silicon layer 32, not regions that will correspond to source and drain regions 300a and 300b later, and impurity ions are implanted into the silicon layer 32, as shown in FIG. 3C.

Subsequently, annealing is carried out. During the annealing process, the impurity ions doped into the source and drain regions 300a and 300b are activated and concurrently the silicon layer 32 containing the amorphous silicon is crystallized into the polycrystalline silicon layer 32a.

In the present invention, a typical high-temperature annealing process such as a rapid thermal annealing (RTA) process is used as the annealing process. Conventional annealing is carried out under an inert $N_2$ or $O_2$ atmosphere while the annealing in the present invention is carried out in an $H_2O$ atmosphere.

The annealing in the $H_2O$ atmosphere shortens annealing time under a condition of the same temperature and reduces annealing temperature under a condition of the same time, compared to the annealing in the $N_2$ or $O_2$ atmosphere.

In particular, a conventional glass substrate that is a transparent insulating substrate is bent due to a high temperature while the substrate according to the present invention is not bent because the annealing temperature may be lowered.

In the present invention, the annealing temperature is preferably in the range of 550 to 750° C. More preferably, the annealing temperature is in the range of 600 to 710° C. because excellent polycrystalline silicon may be achieved with a proper annealing time. Crystallization may not be achieved when the annealing temperature is less than 550° C., and the substrate may be bent when it is more than 750° C.

Further, it is preferable that the pressure of $H_2O$ is in the range of 10,000 Pa to 2 MPa. A crystallization rate is proportional to the pressure and thus when the pressure is too low, the crystallization rate becomes low and the annealing time becomes longer, affecting the substrate. On the other hand, too high of a pressure may cause an explosion. For these reasons, the pressure of 10,000 Pa to 2 MPa is desirable for annealing.

Meanwhile, it is preferable to deposit the silicon layer 32 to a thickness of less than 2,000 Å. Small thickness facilitates crystallizetion. However, too small thickness may affect the device characteristics when the polycrystalline silicon is used to form a thin film transistor. Accordingly, it is more preferable to deposit the silicon layer to a thickness of 300 to 1,000 Å.

Although the above-described processes suffice to obtain the polycrystalline silicon, the present invention may further include an annealing process to reduce defects in the formed polycrystalline silicon.

The further annealing process may be performed by an excimer laser annealing process or heating in the furnace.

Figure 3D:
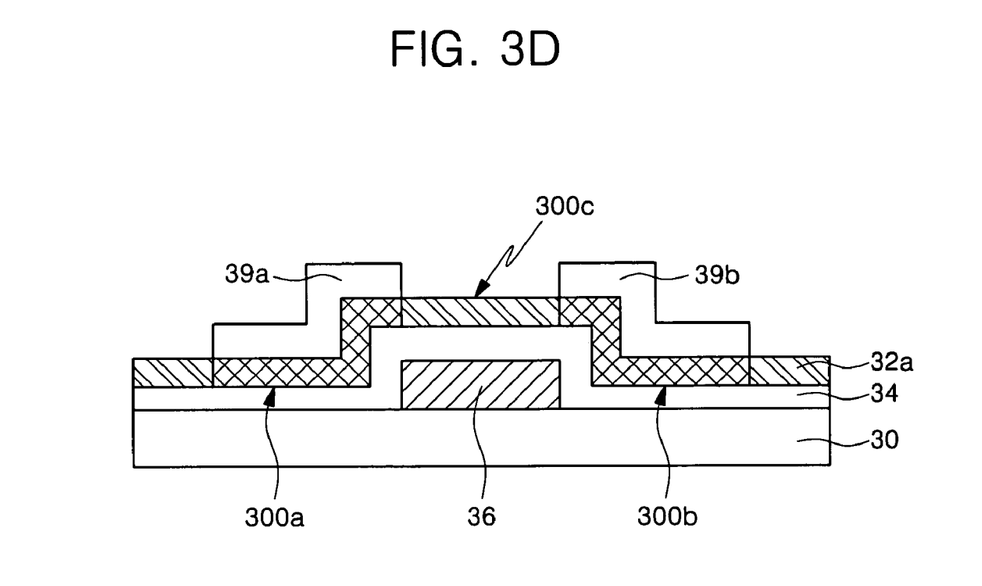

Subsequently, as shown in FIG. 3D, metal is deposited and patterned on the polycrystalline silicon layer 32a over the entire surface of the substrate to form source and drain electrodes 39a and 39b, thereby fabricating a semiconductor device.

In the present invention, it is desirable that the semiconductor device is a thin film transistor. The thin film transistor may be either a top gate thin film transistor in which the gate electrode 36 is formed on the polycrystalline silicon layer 32a, or a bottom gate thin film transistor in which the gate electrode 36 is formed under the polycrystalline silicon layer 32a.

Hereinafter, exemplary examples of the present invention are suggested. However, the examples described below are only intended to assist in understanding the present invention and not to limit the present invention.

EXAMPLES 1 TO 3

An amorphous silicon layer was deposited to a thickness of 500 Å on a substrate. As the deposition method, a low pressure chemical vapor deposition (LPCVD) method was used in Example 1, a plasma enhanced chemical vapor deposition (PECVD) method containing 2% or less of hydrogen was used in Example 2, and a plasma enhanced chemical vapor deposition (PECVD) method containing 10% or more of hydrogen was used in Example 3. The amorphous silicon layer was annealed and crystallized using a rapid thermal annealing (RTA) process at about 710° C. for less than 10 minutes. The annealing was performed using an $O_2$ or $N_2$ carrier gas in an $H_2O$ atmosphere. Raman spectrum of the formed polycrystalline silicon is shown in FIG. 4.

Figure 4:
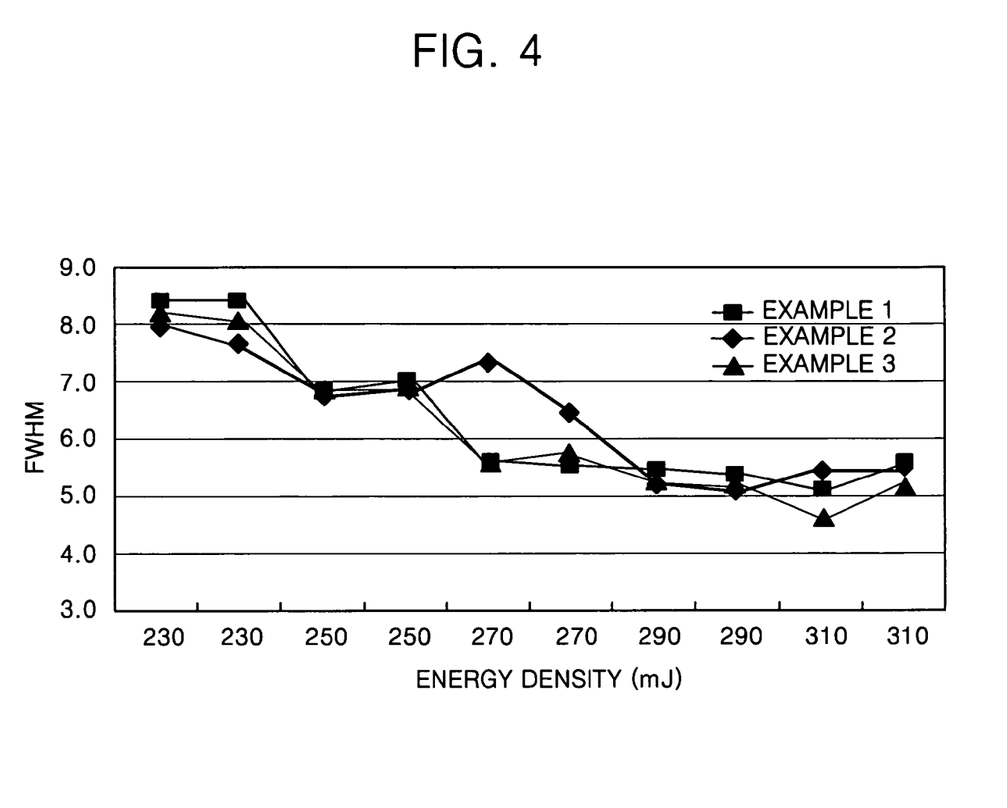
FIG. 4 illustrates FWHM of a polycrystalline silicon thin film fabricated by embodiments of the present invention.

Referring to FIG. 4, it may be seen that the polycrystalline silicon obtained by annealing the amorphous silicon according to Examples 1 to 3 of the present invention has excellent crystallinity because full width at half maximum (FWHM) of a Raman peak is in the range of 4.5 to 7.5 $cm^{-1}$. Considering that polycrystalline silicon fabricated by a typical method has the Raman peak of more than 8.0 $cm^{-1}$, it may be seen that the crystallinity in the present invention becomes excellent by depositing the amorphous silicon using a low pressure chemical vapor deposition (LPCVD) method or a plasma enhanced chemical vapor deposition (PECVD) method and then crystallizing the deposited amorphous silicon by an RTA process in an $H_2O$ atmosphere.

The fabricated polycrystalline silicon thin film is applicable to a thin film transistor, and in turn the thin film transistor may be utilized in a flat panel display device, such as an organic light emitting display device or a liquid crystal display device.

As described above, according to the present invention, it is possible to reduce the annealing time and the annealing temperature by utilizing the $H_2O$ annealing atmosphere when the amorphous silicon is deposited using the LPCVD or PECVD method and crystallized using the solid phase crystallization method, thereby preventing process defects such as a bent substrate and improving the crystallinity of the polycrystalline silicon.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a semiconductor device, comprising:
    depositing a silicon layer containing amorphous silicon on a substrate using a plasma enhanced chemical vapor deposition (PECVD) method or a low pressure chemical vapor deposition (LPCVD) method;
    annealing the silicon layer in an $H_2O$ atmosphere at a temperature to form a polycrystalline silicon layer via solid phase crystallization, the annealing being for less than 10 minutes;
    forming a gate insulating layer on the polycrystalline silicon layer over an entire surface of the substrate;
    forming impurity regions in the polycrystalline silicon layer to define source and drain regions; and
    activating the impurity regions,
    wherein the $H_2O$ pressure is in a range of 10,000 Pa to 2 MPa, and the temperature is in a range of 550 to 750° C.

2. The method according to claim 1, wherein the temperature is in a range of 600 to 710° C.

3. The method according to claim 1, wherein the silicon layer has a thickness of less than 2,000 Å.

4. The method according to claim 3, wherein the silicon layer has a thickness of 300 to 1,000 Å.

5. The method according to claim 1, wherein activating the impurity regions comprises crystallizing non-crystallized amorphous silicon in the polycrystalline silicon layer and at the same time activating the impurity regions by irradiating the impurity regions with a laser.

6. The method according to claim 1, wherein the PECVD method is performed using $SiH_4$+Ar and/or $H_2$ under a pressure of 1 to 1.5 Torr at a temperature of 330 to 430° C., and the LPCVD method is performed using $Si_2H_6$+Ar under a pressure of 0.2 to 0.4 Torr at a temperature of 400 to 500° C.

7. A method of fabricating a semiconductor device, comprising:
    depositing a silicon layer containing amorphous silicon on a substrate using a plasma enhanced chemical vapor deposition (PECVD) method or a low pressure chemical vapor deposition (LPCVD) method;
    doping the silicon layer with impurity ions to define source and drain regions;
    patterning the amorphous silicon to form a semiconductor layer;
    forming a gate insulating layer on the semiconductor layer over an entire surface of the substrate;
    forming a gate electrode on the gate insulating layer, the gate electrode corresponding to a channel region of the semiconductor layer; and
    annealing the amorphous silicon in an $H_2O$ atmosphere at a temperature to crystallize the amorphous silicon via solid phase crystallization and activate the impurity ions, the annealing being for less than 10 minutes,
    wherein the $H_2O$ pressure is in a range of 10,000 Pa to 2 MPa, and the temperature is in a range of 550 to 750° C.

8. The method according to claim 7, wherein the temperature is in a range of 600 to 710° C.

9. The method according to claim 7, wherein the silicon layer has a thickness of less than 2,000 Å.

10. The method according to claim 9, wherein the silicon layer has a thickness of 300 to 1,000 Å.

11. The method according to claim 7, wherein the PECVD method is performed using $SiH_4$+Ar and/or $H_2$ under a pressure of 1 to 1.5 Torr at a temperature of 330 to 430° C., and the LPCVD method is performed using $Si_2H_6$+Ar under a pressure of 0.2 to 0.4 Torr at a temperature of 400 to 500° C.

12. A method of fabricating a semiconductor device, comprising:
    forming a gate electrode on a substrate;
    forming a gate insulating layer on the gate electrode over an entire surface of the substrate;
    depositing a silicon layer containing amorphous silicon on the gate insulating layer using a plasma enhanced chemical vapor deposition (PECVD) method or a low pressure chemical vapor deposition (LPCVD) method;

doping impurity ions into the silicon layer using photoresist to define source and drain regions;

removing the photoresist and then annealing the amorphous silicon in an $H_2O$ atmosphere at a certain temperature to crystallize the amorphous silicon via solid phase crystallization and to activate the impurity ions, the annealing being for less than 10 minutes; and depositing and patterning a metal layer to form source and drain electrodes in the source and drain regions, wherein the $H_2O$ pressure is in a range of 10,000 Pa to 2 MPa, and the temperature is in a range of 550 to 750° C.

13. The method according to claim 12, wherein the temperature is in a range of 600 to 710° C.

14. The method according to claim 12, wherein the silicon layer has a thickness of less than 2,000 Å.

15. The method according to claim 14, wherein the silicon layer has a thickness of 300 to 1,000 Å.

16. The method according to claim 12, wherein the PECVD method is performed using $SiH_4$+Ar and/or $H_2$ under a pressure of 1 to 1.5 Torr at a temperature of 330 to 430° C., and the LPCVD method is performed using $Si_2H_6$+Ar under a pressure of 0.2 to 0.4 Torr at a temperature of 400 to 500° C.

* * * * *